(12) United States Patent
Glovatsky

(10) Patent No.: US 7,161,092 B2
(45) Date of Patent: Jan. 9, 2007

(54) APPARATUS AND METHOD FOR PROTECTING AN ELECTRONIC CIRCUIT

(75) Inventor: Andrew Glovatsky, Plymouth, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 93 days.

(21) Appl. No.: 10/123,793

(22) Filed: Apr. 15, 2002

(65) Prior Publication Data

US 2003/0193113 A1 Oct. 16, 2003

(51) Int. Cl.
*H01L 23/28* (2006.01)

(52) U.S. Cl. .................. 174/522; 174/524; 174/525

(58) Field of Classification Search .............. 174/35 R, 174/35 MS, 520, 522, 524, 525; 361/816, 361/818
See application file for complete search history.

(56) References Cited

U.S. PATENT DOCUMENTS

| | | | | |
|---|---|---|---|---|
| 3,579,821 A | | 5/1971 | Kurisu .................. 29/627 |
| 4,661,888 A | * | 4/1987 | Jewell et al. ............... 361/818 |
| 5,166,864 A | * | 11/1992 | Chitwood et al. .......... 361/720 |
| 5,278,562 A | | 1/1994 | Martin et al. .................. 342/1 |
| 5,318,855 A | | 6/1994 | Glovatsky et al. |
| 5,334,874 A | | 8/1994 | Metzler et al. ............. 257/678 |
| 5,394,304 A | * | 2/1995 | Jones ......................... 361/765 |
| 5,557,064 A | * | 9/1996 | Isern-Flecha et al. .. 174/35 MS |
| 5,739,463 A | * | 4/1998 | Diaz et al. ................. 174/35 R |
| 5,867,371 A | * | 2/1999 | Denzene et al. ............. 361/816 |
| 5,907,189 A | | 5/1999 | Mertol ........................ 257/787 |
| 6,191,955 B1 | | 2/2001 | Guillot et al. ............... 361/820 |
| 6,256,878 B1 | | 7/2001 | Keane .......................... 29/841 |
| 6,265,784 B1 | | 7/2001 | Kawano et al. ............. 257/788 |
| 6,271,581 B1 | | 8/2001 | Huang et al. ................ 257/666 |
| 6,286,684 B1 | | 9/2001 | Brooks et al. ............... 206/710 |
| 6,313,526 B1 | | 11/2001 | Nakamura ................... 257/706 |
| 6,545,861 B1 | * | 4/2003 | Hayes et al. ................. 361/642 |
| 6,596,937 B1 | * | 7/2003 | Mazurkiewicz ........... 174/35 R |
| 6,768,654 B1 | * | 7/2004 | Arnold et al. ............... 361/818 |
| 6,900,383 B1 | * | 5/2005 | Babb et al. ............ 174/35 MS |

FOREIGN PATENT DOCUMENTS

| | | |
|---|---|---|
| EP | 0 388 217 A1 | 9/1990 |
| WO | WO 95/27341 | 10/1995 |
| WO | WO 03/015487 A1 | 2/2003 |

OTHER PUBLICATIONS

Search Report for Application No. GB 0304552.3 dated Jul. 29, 2003.

* cited by examiner

*Primary Examiner*—Hung V. Ngo
(74) *Attorney, Agent, or Firm*—Brinks Hofer Gilson & Lione

(57) ABSTRACT

The present invention provides in one embodiment, a system for encapsulating a substrate on a vehicle structure. The system includes the substrate, the vehicle structure and a package substrate. The substrate has a top portion and a bottom portion. The vehicle structure is operatively connected to the bottom portion of the substrate. The package substrate has a plurality of layers, where the package substrate is operatively connected to the top portion of the substrate. The package substrate conforms to a periphery area of the top portion of the substrate.

13 Claims, 5 Drawing Sheets

US 7,161,092 B2

APPARATUS AND METHOD FOR PROTECTING AN ELECTRONIC CIRCUIT

FIELD OF THE INVENTION

This invention relates generally to a method and apparatus for protecting an electronic circuit. More particularly, this invention relates to a method and apparatus for protecting the electronic circuit from damage caused by electromagnetic charge.

BACKGROUND OF THE INVENTION

Typically, electrical circuits or electronic modules are enclosed in housings when they are incorporated into a working electronic system or before they are sold by manufacturers. These electrical circuits typically include integrated circuits, resistors, transistors, diodes, semiconductors, processors, capacitors, and any other electrical components associated with electrical circuits.

The housings protect fragile electronic circuits from damage caused by mechanical damage. In addition, the packages shield the modules from the surrounding environment so as to preclude contamination, corrosion and other detrimental effects resulting from exposure. Further, the packages protect the circuits from disruptions caused by electromagnetic interference (EMI). EMI energy is any undesired conducted or radiated electrical disturbance that can interfere with the operation of the electrical circuit.

Prior art housings utilized to protect the electrical circuits or electronic modules typically seal the electrical circuits within a container, metal box or enclosure having a body of electrically insulating or conducting material. These current packages have shortcomings, however. First, the packages may not adequately protect the circuits from mechanical damage, the surrounding environment and EMI, because some containers are not able to adequately encapsulate the circuits. Next, the packages are costly and add manufacturing steps and process costs to the electronics. There is a need for a housing or package that adequately protects the circuit and is cost-efficient.

BRIEF SUMMARY OF THE INVENTION

The present invention provides in one embodiment, a system for encapsulating a substrate on a vehicle structure is disclosed. The system includes the substrate, the vehicle structure and a package substrate. The substrate has a top portion and a bottom portion. The vehicle structure is operatively connected to the bottom portion of the substrate. The package substrate has a plurality of layers, where the package substrate is operatively connected to the top portion of the substrate. The package substrate conforms to a periphery area of the top portion of the substrate.

In another embodiment of the invention, a system for encapsulating a substrate on a vehicle structure is disclosed. The system includes a substrate, the vehicle structure and a package substrate. The substrate has a top portion and a bottom portion. The vehicle structure is operatively connected to the bottom portion of the substrate. The package substrate has at least three layers, where the package substrate is operatively connected to the top portion of the substrate. The package substrate conforms to an internal portion of the substrate.

In yet another embodiment of the invention, a system for encapsulating a substrate on a vehicle structure is disclosed. The system includes a substrate, the vehicle structure and a package substrate. The substrate has a top portion and a bottom portion. The vehicle structure is operatively connected to the bottom portion of the substrate. The package substrate has at least three layers, where the package substrate is operatively connected to the top portion of the substrate. The package substrate conforms to an internal portion and a periphery area of the substrate.

In another embodiment of the invention, a method for protecting a substrate from electromagnetic charge is provided. A polymer conformal coating is applied to a substrate having a top portion and a bottom portion. The bottom portion of the substrate is connected to the structure. A package substrate that has at least three layers is placed over the top portion of the substrate. The package substrate is operatively connected to the top portion of the substrate. The package substrate also conforms to a peripheral area of the top portion of the substrate.

In another embodiment of the invention, a method for protecting a substrate having a top portion and a bottom portion from electromagnetic charge is disclosed. The substrate is sprayed with a liquid solution. The bottom portion of the substrate is connected to the structure. A conformal film having at least three layers is placed over the top portion of the substrate. The package substrate operatively connects to the top portions of the substrate. The package substrate conforms to a peripheral area of the top portion of the substrate.

In yet another embodiment of the invention, a package substrate apparatus is disclosed. The package substrate has at least three layers. The package substrate is operatively connected to a substrate, where the package substrate conforms to a periphery area of the substrate.

In yet another embodiment of the invention, a package substrate apparatus is disclosed. The package substrate has at least three layers. The package substrate is operatively connected to a substrate, where the package substrate conforms to an internal portion of the substrate.

DETAILED DESCRIPTION OF THE INVENTION

Figure 1A:
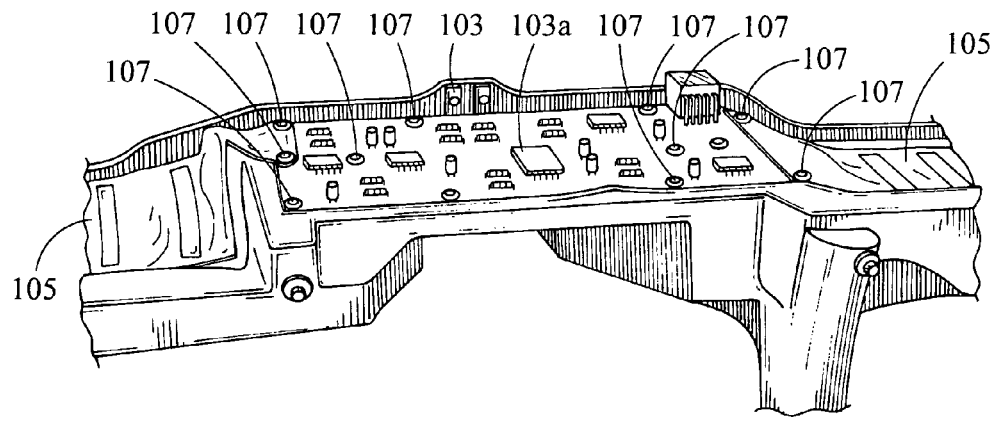
FIG 1a is a graphical illustration of a close-up view of a structure in a vehicle operatively connected to a one-sided substrate, according to an embodiment of the invention.

Referring to the figures, FIG. 1*a* is an illustration of an overview of a structure in a vehicle system according to an embodiment of the invention. In this embodiment, there is a structure 101 that may be a magnesium structure or a cross car beam included in the vehicle system. Typically, the cross car beam provides structural support in an instrument panel or dashboard of the vehicle. This structure may also be a computer housing, any type of vehicle structure, or any structure that is capable of receiving electrical circuits. Common structures in a vehicle include: a door structure, a roof structure, a floor structure, or a plastic parts structure. Structure 101 may include a recessed portion or a 3D portion that receives a device 103. This recessed portion is operatively connected to device 103 or a substrate 103. In addition, structure 101 may have a flat surface, a 3D surface or a radius surface that receives device 103. This flat surface is operatively connected to device 103. Even though it is not shown, device 103 may be a flexible structure that is able to conform to the shape of the recessed portion or 3D portion of structure 101. After this flexible structure 101 conforms to the shape of the recessed portion of structure 101, then it is operatively connected to this recessed portion of structure 101.

Device 103 has a top portion, which has an electrical circuit 103*a*. Device 103 also includes a bottom portion (not shown) that operatively connects device 103 to structure 101. The bottom portion may also include an electrical circuit (not shown). If device 103 only includes a top portion having an electric circuit 103*a*, then device 103 may be referred to as a one-sided substrate or one-sided electrical substrate. If device 103 includes a top portion having an electric circuit 103*a* and the bottom portion having an electric circuit, then it may be referred to as a double-sided substrate or double-sided electrical substrate. The bottom portion may include a liquid adhesive, thermal tape or glue to bond or operatively connect device 103 to the recessed portion of structure 101 and/or a flat portion of structure 101. In addition, a plurality of fasteners may be inserted through the top portion of device 103 to bond or operatively connect device 103 to structure 101. Further, device 103 is operatively connected to structure 101 by inserting press fit pins 107 through a top portion of device 103. A sealing or bonding means may be utilized to bond device 103 to structure 101.

The electronic circuit 103*a* may include: at least one relay, at least one resistor, at least one capacitor, at least one processor and any other component that may be part of an electronic circuit. This electronic circuit may control various components in a vehicle instrument cluster such as, climate control, ignition, airbags, radio, lights or windows. Device 103 may also include takeout buses or flatwire substrates 105 on either end. The takeout buses 105 may also be fiber optic buses or light channeling mediums. Takeout buses 105 connect the device to various electronic components of the vehicle. In addition, takeout buses 105 may also be utilized to operatively connect the device 103 to a battery to receive any energy or power from the vehicle. Then device 103 may distribute this power to the electrical components of the vehicle such as the radio, ignition or climate control.

Figure 1B:
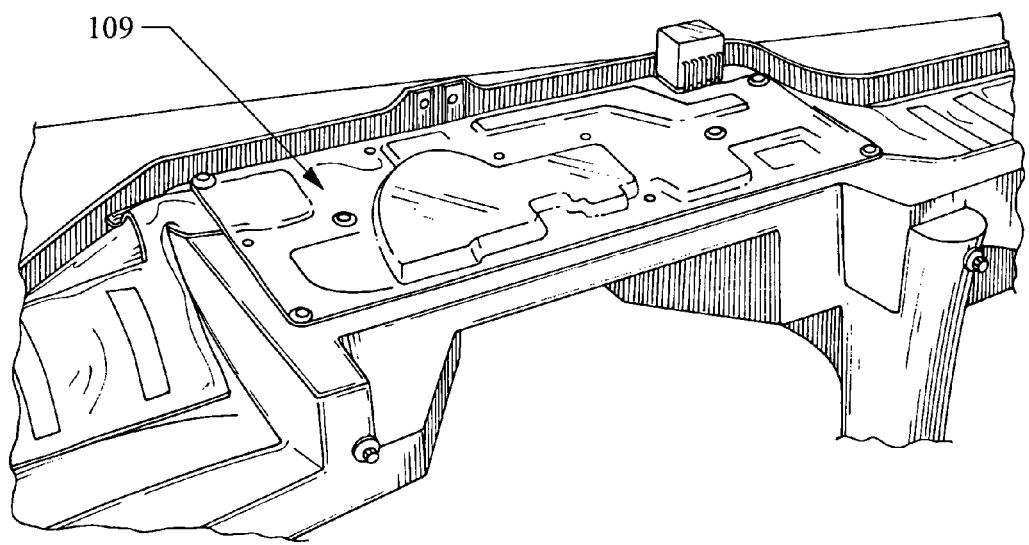
FIG. 1b is another graphical illustration of yet another overview of the structure in the vehicle operatively connected to the one-sided substrate, according to an embodiment of the invention.
Figure 1C:
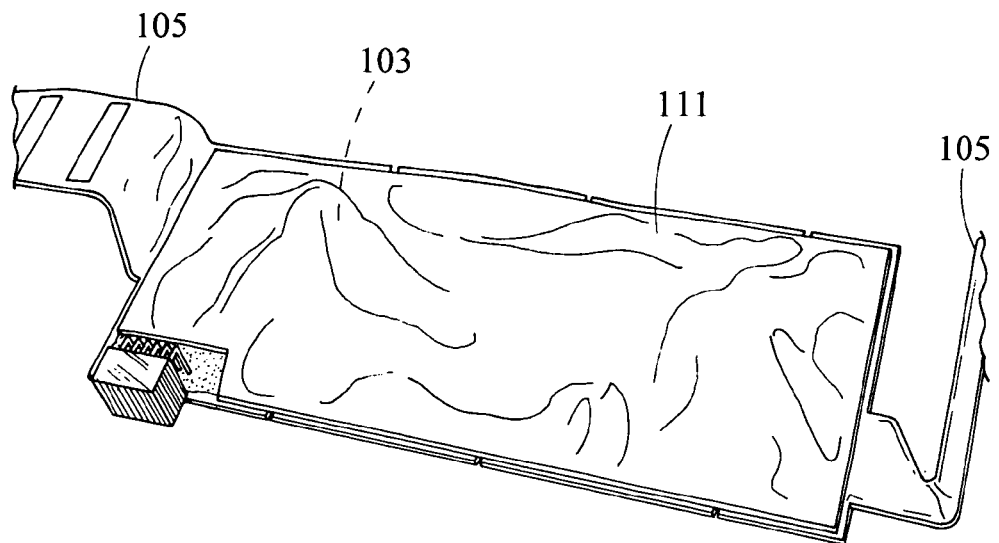
FIG. 1c is a graphical illustration of a conformal film encapsulating a one-sided substrate, according to an embodiment of the invention.

FIG. 1*b* is another graphical illustration of yet another overview of the structure in the vehicle, according to an embodiment of the invention. In this embodiment, a conformal film is utilized to protect the electronic circuit. This conformal film may have a flexible structure 111, as shown in FIG. 1*c*, or a rigid structure 109. In this preferred embodiment, this conformal film is a combination of at least two layers of films or a plurality of layers of film. Preferably, the conformal film includes a combination of at least three layers of film. There can also be more layers of different materials in the conformal film 111 depending upon the properties needed.

The three layers are a bottom layer, a middle layer, and an outer layer. These three layers may be laminated or bonded together to make a single comformal film. The bottom layer may be referred to as an inner layer or a first layer. The bottom layer is an insulative layer. This insulative layer may be made of an electrostatic discharge film or polymer such as, polyester phthalate (PET), polyester napthalate (PEN), polyethylene, polymide or any other insulative polymer that is known to those of ordinary skill in the art.

In this embodiment, conformal film 109 includes: an outer layer made of a PET material with a 0.001 inch thickness; a middle layer made of a copper material with a 0.010 inch thickness; and an inner layer made of a PET material with a 0.001 inch thickness.

The middle layer or second layer is preferably able to protect the electronic circuit from electromagnetic charge. Thus, the middle layer should be made of a metal layer such as, a tin plated copper film or aluminum laminated to the inner and outer layers of the film. Preferably, the metal layer is a solid sheet; however, the metal layer can be a grid with specific opening sizes where the size depends on the frequency to be shielded from the underlying electronics.

This metal layer should have a minimum range of thickness of 0.0005 inches. This metal layer utilizes metal plating materials to protect it from corrosion, such as, a copper layer that is nickel and tin plated, which are corrosion resistance materials. These metal plating materials are useful for soldering the metal layer to ground it to device 103 or takeout buses 105.

The outer layer may be referred to as a third layer or a plastic layer. The outer layer should be a high puncture and abrasion resistance film such as, Tyvek, Teflon or PET. In addition, the inner and/or outer layer of the conformal film may have at least one opening so that the middle layer or metal layer is exposed. This at least one opening allows the exposed metal layer to be soldered or metallurgically bonded to ground the metal layer to the device 103 or takeout buses 105. This grounding point on the conformal film allows the conformal film to dissipate the EMI it receives from components on device 103. Thus, the conformal film can receive the EMI from device 103, then discharge it so device 103 remains cool and does not experience break down.

There are a number of ways to fabricate the flexible structure conformal film 111 or rigid structure conformal film 109. The conformal film may be fabricated by typically roll laminating the three films together in a continuous roll process. Next, the three films are aligned and rolled together between rollers where heat and pressure are applied, and then the conformal film is formed. Rigid structure conformal film 109 may be made by placing an adhesive layer on each side of each layer of the three layers that will be bonded to another layer of the three layers. The three layers are then stacked on top of each other, and then the stack is positioned in a press where heat and pressure are applied and then the conformal film 109 is created. Another way to form the conformal film 109 is by utilizing a stamping process. This stamping process utilizes a special tool to make an impression of the circuit. After the impression is made, then the stamping process utilizes a typical steel two part tool that stamps a flat sheet such as, conformal film 111, into a 3D part that is conformed around the impression. Those of ordinary skill in the art recognize there may be other ways in which a conformal film 111 structure may be produced that can be utilized by this invention.

FIG. 1c is a graphical illustration of a conformal film encapsulating a one-sided substrate, according to an embodiment of the invention. In this embodiment, the electrical circuit 103a includes takeout buses 105, where electrical circuit 103a is completely covered by a conformal film 111 or a package substrate. In this embodiment, conformal film 111 includes: an outer layer made of a PET material with a 0.0001 inch thickness; a middle layer made of an aluminum material with a 0.0005 inch thickness; and a bottom layer made of a PET material with a 0.001 inch thickness. Thus, due to the thinness of the films the conformal film 111 is flexible.

Preferably, there are a number of ways the conformal film 111 may conform to the shape of the electronic circuit 103a or device 103. First, an operator may utilize a vacuum sealant method to make the film conform to device 103. In this method, the operator places the conformal film 111 on a top portion of the electronic circuit 103a. Then, the operator may utilize a hot bar or sealant method to melt the bottom layer of conformal film 111 onto device 103 or electronic circuit 103a or takeout buses 105. The hot bar may be applied on an outside portion of conformal film 111 to melt the bottom layer to a bonding area of the periphery portion of device 103. Further, the hot bar may be applied to the outside portion of conformal film 111 to melt the bottom layer to the bonding area of a periphery portion of device 103. The terms periphery area or portion of the electronic circuit 103a or device 103 may be utilized interchangeably with the terms: an internal portion such as, where the press fit pins 107 are located on electronic circuit 103a or device 103, and a combination of the internal portion and periphery portion of electronic circuit 103a or device 103. The hot bar may be applied to the bonding area for a time period of 0.1–15 seconds, at a pressure range of 0.1–10,000 psi and a temperature range of 50° C.–500° C. Typically, the hot bar may be utilized for a time period of 1–3 seconds, a pressure range of 10–20 psi and a temperature range of 60° C.–200° C.

The bottom layer of conformal film 111 is bonded or operatively connected to open sides of a periphery or peripheral portion of device 103. The bonding area or bonding line, where the hot bar is utilized, should be wide enough, such as 1–10 millimeters, for attachment features to go through the bond line. The attachment features may be press fit clips or screws.

However, when the bar goes to bond a last open side of the periphery portion of device 103 a vacuum device is inserted in between the bottom layer of conformal film 111 and device 103. The vacuum device is utilized to draw out air in between the conformal film 111 and the electronic circuit 103a. When all the air is drawn out, then the film is conformed to electronic circuit 103a or device 103. Next, the operator may utilize the hot bar to bond or operatively connect the conformal film 111 to the last open side of the periphery portion of electronic circuit 103a or device 103. It is important that the film conform to device 103 so that when the device 103 is utilized the film may not move or vibrate. If the film moves or vibrates it may cause noise, wear and abrasion, which can lead to shorting of the components that the film is covering on device 103.

Second, an operator may place the conformal film 111 on the electronic circuit 103a. Then, the operator may utilize the hot bar or another sealant method to seal or operatively connect the conformal film to the periphery portion of device 103 or electronic circuit 103a or takeout buses 105. The hot bar may be applied on an outside portion of conformal film 111, as described above, to melt the bottom layer to the bonding area onto the periphery portion of device 103. Next, the bottom layer of the conformal film 111 melts onto electronic circuit 103a. Thus, the conformal film may have a tight fit around the periphery portions of electronic circuit 103a or device 103.

Lastly, an operator may place the conformal film about the periphery portions of device 103. Next, the operator may utilize a sealant or sealant method, as described below, to seal or operatively connect conformal film 111 to electronic circuit 103a. Thus, the conformal film encapsulates the electronic circuit 103a.

There are many types of sealant methods that may be utilized to bond conformal film 111 to device 103 such as, soldering, welding and utilization of a double sided tape. Those of ordinary skill in the art know that at least two materials may be bonded together by utilizing a soldering method or a welding method, so descriptions of these methods have been omitted. The double-sided tape sealant method requires an operator to bond a bottom portion or outer layer of the conformal film 111 to the top portion of the tape. In addition, the other side of the tape is adhesively coupled, bonded or operatively connected to the electronic circuit 103a or a top portion of takeout buses 105. The double-sided tape method may also be utilized to bond another conformal film to a bottom portion 103b. In this method, the top portion of the double-side tape is adhesively connected between a top portion of another conformal film and the bottom portion 103b. Next, the bottom portion of the double-side tape is adhesively connected between a bottom portion of another conformal film and the top portion of structure 101. Thus, the double-sided tape bonds conformal film 111 to electrical circuit 103a or takeout buses 105.

There are various adhesives that can be utilized as sealants such as, a liquid adhesive and pressure sensitive adhesives to bond conformal 111 to device 103 for a long period of time. A typical adhesive material is silicone and a common pressure sensitive adhesive material is acrylics. The liquid adhesive process can take from 2 minutes to 1 hour or more to bond conformal film 111 to device 103. Another sealant method is a lamination process that utilizes an epoxy or hot melt. The lamination process utilizes the epoxy or hot melt to physically bond the conformal film 111 onto device 103. The hot melt process may take any where from 1 second to approximately 20 minutes to bond conformal film 111 to device 103 or electrical circuit 103a.

Lastly, another sealant method that may be utilized is a heat sealant that melts the conformal film 111 onto device 103 or electronic circuit 103a. By utilizing a heat sealant conformal film is bonded to device 103 within 10 seconds to 5 minutes. Those of ordinary skill in the art recognize there are many other ways to bond or seal two or more materials together that may be utilized by this invention.

Figure 2:
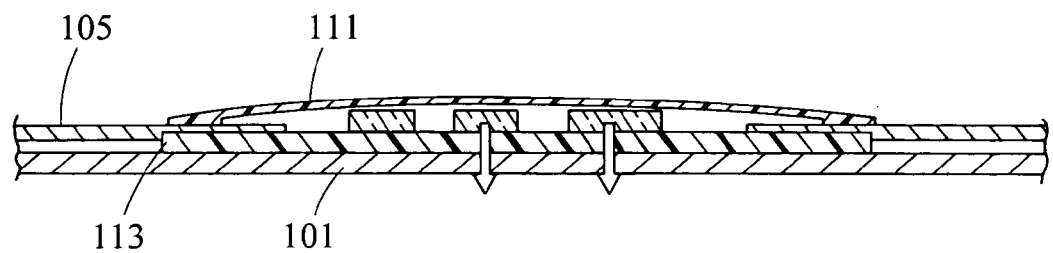
FIG. 2 is a graphical illustration of a conformal film encapsulating a one-sided substrate, according to an embodiment of the invention.

FIG. 2 is a graphical illustration of a conformal film encapsulating a one-sided substrate, according to an embodiment of the invention. In this embodiment, conformal film 111 is bonded or sealed, as described above, to takeout buses 105. The sealing process, as described above, may be caused by a lamination process, a double adhesive tape, a liquid adhesive process or a heat seal process. However, takeout buses 105 may be removed or not utilized causing the conformal film 111 to be sealed to device 103 or electrical circuit 103a.

This figure also discloses capillary gaps 113 that may be formed between device 103 and takeout buses 105. An external adhesive may be used to fill the capillary gaps 113, so there will be a secure bond between the conformal film 111 and device 103. In addition, a bonding method or sealant described above may be used to bond capillary gaps 113 to conformal film 111. Structure 101 provides support for the device 103, conformal film 111 and capillary gaps 113. By utilizing this conformal film 111, device 103 is protected from an electromagnetic charge and any person that may incidentally contact device 103. Typically, a large metal or plastic cover is utilized to cover the electronics, but this cover tends to be too bulky and inefficient whereas conformal film 111 is adequate and provides adequate protection. In addition, the conformal film 111 prevents device 103 from becoming over heated, because the conformal film 111 absorbs the heat, then radiates the heat out through the top portion of the film. Further, the closer film 111 is to device 103 the more conformal film 111 acts as a heat sink to receive the heat from device 103 and radiate the heat through the top portion of the conformal film. Thus, film 111 provides a means to cool device 103.

Figure 3:
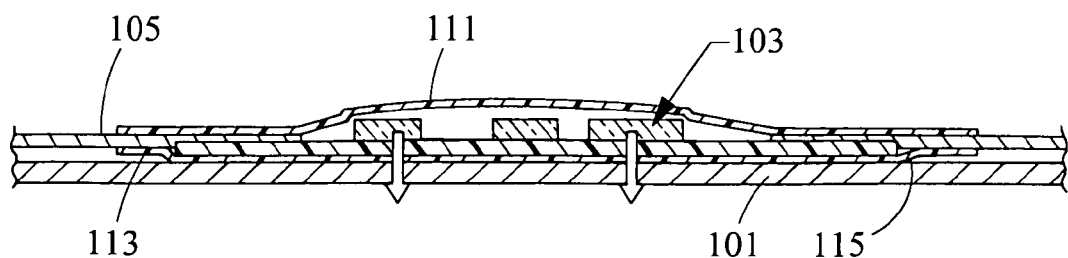
FIG. 3 is a graphical illustration of two conformal films encapsulating the one-sided substrate, according to an embodiment of the invention.

FIG. 3 is a graphical illustration of two conformal films encapsulating the one-sided substrate according to an embodiment of the invention. In this embodiment, there are two conformal films: conformal film 111 and a conformal film 115. Conformal film 111 may be referred to as a package substrate and conformal film 115 may be referred to as another package substrate. Conformal film 111 is bonded to a periphery area of the electronic circuit 103a or device 103. Through the means described previously, conformal film 115 is affixed or operatively connected to a periphery area of the bottom portion 103b there between the bottom portion 103b and structure 101. In additional, conformal film 115 is also operatively connected or sealed to an underside of takeout buses 105. This conformal film 115 is bonded to the bottom portion 103b and structure 101 by utilizing the various sealing methods and/or sealants described above.

Figure 4:
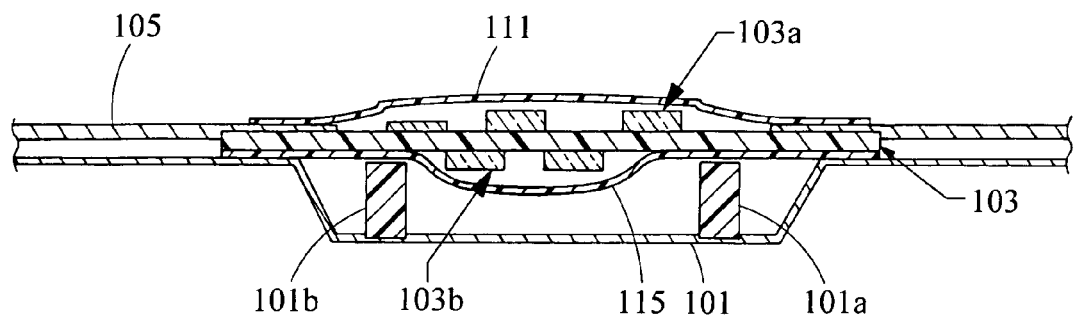
FIG. 4 is a graphical illustration of a double-sided substrate encapsulated by two conformal films where a structure includes structural supports, according to an embodiment of the invention.

FIG. 4 is a graphical illustration of a double-sided substrate encapsulated by two conformal films, according to an embodiment of the invention. In this embodiment, there are two conformal films, as described above. In addition, device 103 may be a one-sided substrate instead of a double-sided substrate. Conformal film 111 is sealed to the electronic circuit 103a, as described above. Conformal film 115 is bonded to the periphery area of bottom portion 103b having an electronic circuit. Structure 101 includes a recessed portion that has structural supports 101a and 101b to receive device 103 with conformal film 115. Structural supports 101a and 101b may be made of plastic, metal or any material that is able to provide a sufficient support for an electronic circuit. When the device 103 heats up the heat is dissipated through conformal film 111, conformal film 115 and structure 101, which cools the device 103.

Figure 5:
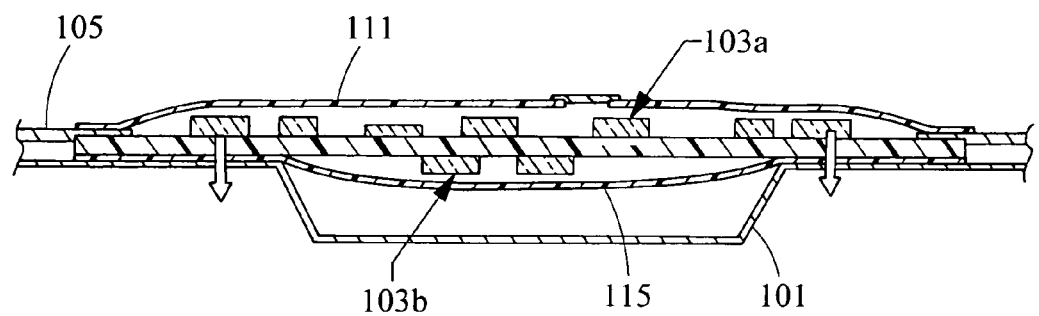
FIG. 5 is another graphical illustration of a double-sided substrate encapsulated by two conformal films, according to another embodiment of the invention.

FIG. 5 is a graphical illustration of a double-sided substrate encapsulated by two conformal films according to another embodiment of the invention. There are two conformal films 111, 115 that encapsulate the device 103 or double-sided substrate as in FIG. 4. However, in this embodiment there are no structural supports in structure 101. In addition, device 103 encompasses a larger surface area so the recessed portion of structure 101 is only able to receive a portion of conformal film 115 and bottom portion 103b, while the flat portion of structure 101 is able to receive the other portion of bottom portion 103b. Since the device 103a encompasses a larger area outside of the recessed portions of structure 101 heat transfer occurs through the flat portion of structure 101 instead of the recessed portions.

Figure 6:
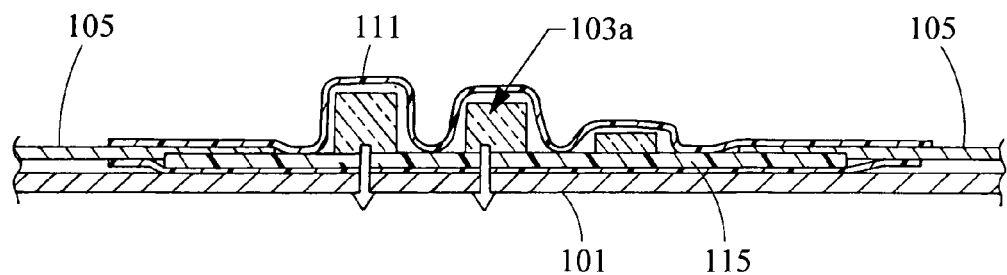
FIG. 6 is a graphical illustration of a one-sided substrate that includes large components encapsulated by a conformal film, according to an embodiment of the invention.

FIG. 6 is a graphical illustration of a one-sided substrate that includes large components that are encapsulated by a conformal film, according to an embodiment of the invention. This one-sided substrate may have electrical components on electronic circuit 103a, as described above. However, these electrical components may have a height greater than 10 millimeters. Conformal film 111 covers the electronic components of electronic circuit 103a to protect it from electromagnetic charge. The close proximity of conformal film 111 to electric circuit 103a enables a large of amount of heat to transfer from the electrical components of circuit 103a through the conformal film 111.

When the heat is dissipated through conformal film 111 electronic circuit 103a cools and does not experience breakdown. Preferably, conformal film 111 is bonded to the periphery area of device 103 by utilizing the vacuum sealant method, described above. In the vacuum sealant method, all the air drawn out between the conformal film 111 and device 103, and then conformal film 111 may or may not be bonded to takeout buses 105, by utilizing any of the sealant methods or sealants described above. Takeout buses 105 may be bonded to the periphery area of device 103, by utilizing any of the sealant methods, described above. Takeout buses 105, connects the device to various electronic components of the vehicle. In addition, takeout buses 105 may also be utilized to operatively connect the device 103 to a battery to receive any energy or power from the vehicle.

Figure 7:
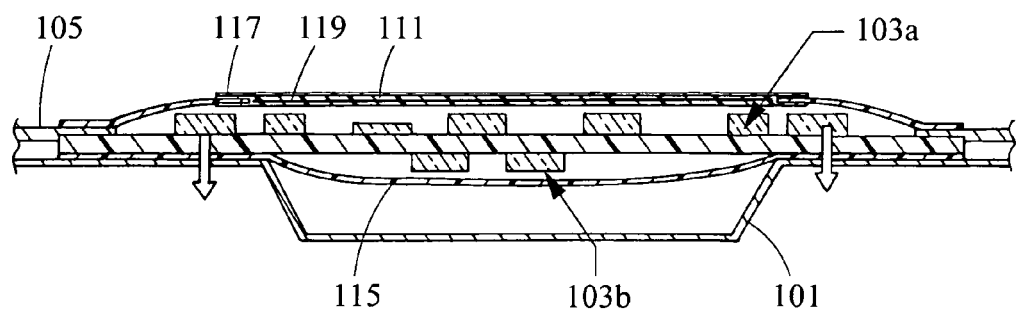
FIG. 7 is a graphical illustration of a double-sided substrate including a breather valve encapsulated by two conformal films, according to yet another embodiment of the invention.

FIG. 7 is a graphical illustration of a double-sided substrate encapsulated by two conformal films according to yet another embodiment of the invention. This embodiment is very similar to FIG. 6 in many ways; however, in this embodiment conformal film 111 includes at least one breather valve 117 and at least one internal dessicant film 119. As the electrical circuit 103a heats up moisture may collect on the circuit. In order to remove the moisture from electronic circuit 103a, at least one small opening or breather valve 117 on top of the outer layer of conformal film 111 may be utilized, so that moisture may be released through the conformal film.

Preferably, a Teflon film is placed over the breather valve 117, so that too much moisture does not dissipate through conformal film 111. Breather valve 117, utilized by conformal film 111 over a period of time, may cause damage to electrical circuit 103a, because moisture may be allowed to come through the Teflon film damaging electronic circuit 103a. Internal dessicant film 119 is utilized to protect electrical circuit 103a from damage caused by utilizing the breather valve 117 by preventing the moisture that goes through breather valve 117 from contacting electrical circuit 103a. The dessicant film 119 provides an extra film layer to protect the electronic circuit 103a from damage. The internal dessicant film 119 may be laminated, glued or bonded to the inner layer of conformal film 111. Thus, the internal dessicant film 119 is able to prevent moisture from coming through the top layer of conformal film 111 and contacting electronic circuit 103a. Internal dessicant film 119 may be made of a silica type material or any type of material that is able to absorb moisture.

In another embodiment of FIG. 7, there are at least two breather valves 117 on conformal film 111. However, the inner layer of conformal film 111 does not include the internal dessicant film 119. There are other methods utilized to protect the electronic circuit 103a from moisture such as, dipping or curing device 103 in a polymer conformal coating such as, epoxy or silicone before the conformal film 111 is placed over the device. Then the device 103 with epoxy is operatively connected to structure 101 as described above. A conformal film 111 having at least three layers is then placed over the device 103 or top portion 103a, where the conformal film conforms, as described above, to a peripheral area of the top portion 103a or device 103.

Another method utilized is to spray the device 103 with a liquid solution containing the materials in the conformal film 111 as described above. Then the sprayed device 103 is operatively connected to structure 101. The conformal film is then placed over the device 103 or top portion 103a, where the conformal film conforms, as described above, to a peripheral area over the device 103 or a top portion 103a. Thus, the electronic circuit 103a is prevented from collecting too much moisture.

Figure 8:
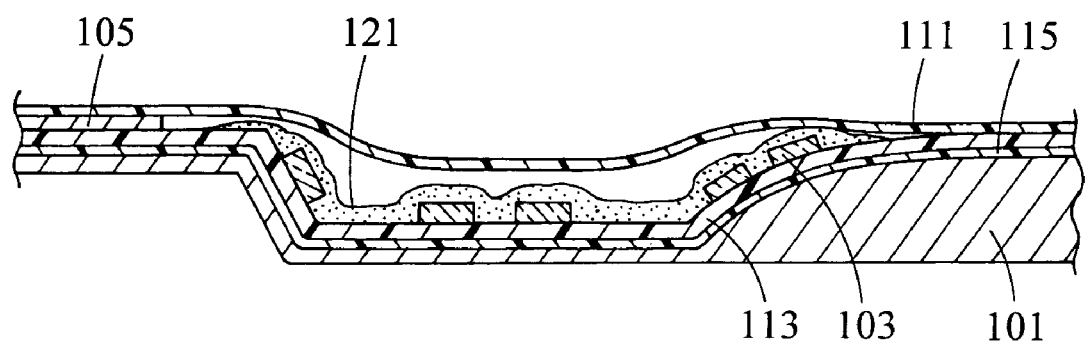
FIG. 8 is a graphical illustration of a flexible one-sided substrate encapsulated by two conformal films according to yet another embodiment of the invention.

FIG. 8 is a graphical illustration of a flexible one-sided substrate encapsulated by two conformal films according to yet another embodiment of the invention. This embodiment, is very similar to FIG. 7, however in this embodiment the device 103 is a flexible one-sided substrate that is able to conform to the recessed or 3D portion of structure 101. A polymer conformal coating 121 may be applied to cover device 103 before it is operatively connected into recessed or 3D portion 101, then encapsulated by conformal films 111 and 115. This polymer conformal coating 121 may be made of a material such as silicone, urethane, acrylics or epoxy. In addition, polymer conformal coating 121 may be made of a combination of materials such as, silicone, urethane, acrylics and epoxy.

Conformal films 111 and 115 conform to the flexible device 103 by utilizing the conforming and/or encapsulating methods described above. This device 103 may be a one-sided substrate or a double-sided substrate. Device 103 may be angled, beveled or shaped in any manner to conform to the shape of structure 101. Even though, this embodiment does not include at least one breather valve 117 and the at least one dessicant film 119, these features may also be included in the embodiment.

Thus it is intended that the foregoing detailed description be regarded as illustrative rather than limiting and that it be understood that it is the following claims, including all equivalents, which are intended to define the scope of the invention.

The invention claimed is:

1. A system for encapsulating a substrate on a vehicle structure, the system comprising:
   the substrate having a top portion and a bottom portion, said bottom portion connected to the vehicle structure; and
   a package substrate having a plurality of layers, including an inner insulative layer, wherein the package substrate is operatively connected to the top portion of the substrate, wherein the package substrate conforms to a periphery area of the top portion of the substrate, and wherein the inner layer is a continuous sheet within the periphery area and the inner layer encompasses the entire extent of the package substrate wherein there is another package substrate operatively connected to the bottom portion of the substrate there between the bottom portion of the substrate and the structure, wherein the package substrate includes at least one small opening, and the at least one small opening is a breather valve,
   wherein the package substrate further comprises an internal dessicant film, wherein the internal dessicant film is bonded to a bottom layer of the plurality of layers of the package substrate.

2. The system of claim 1, wherein the package substrate is a conformal film.

3. The system of claim 1, wherein the top portion of the substrate is an electronic circuit.

4. The system of claim 3, wherein electrical components of the electronic circuit have a height greater than 10 millimeters.

5. The system of claim 4, wherein the package substrate is operatively connected to the top portion of the substrate by a vacuum sealant method.

6. The system of claim 1, wherein the package substrate is operatively connected to the substrate by utilizing a sealant.

7. The system of claim 6, wherein the sealant is a liquid adhesive.

8. The system of claim 1, wherein the bottom portion of the substrate includes an electronic circuit.

9. The system of claim 8, wherein the structure includes structural supports.

10. The system of claim 1, wherein the substrate is a flexible substrate so that it can conform to a shape of the vehicle structure.

11. The system of claim 1, wherein the internal dessicant film is made of a silica material.

12. A system for encapsulating a substrate on a vehicle structure, the system comprising:
    the substrate having a top portion and a bottom portion, said bottom portion connected to the vehicle structure; and
    a package substrate having a plurality of layers, including an inner insulative layer, wherein the package substrate is operatively connected to the top portion of the substrate, wherein the package substrate conforms to a periphery area of the top portion of the substrate, and wherein the inner layer is a continuous sheet within the periphery area and the inner layer encompasses the entire extent of the package substrate, wherein package substrate further comprises an internal dessicant film, and the internal dessicant film is bonded to a bottom layer of the plurality of layers of the package substrate.

13. The system of claim 12, wherein the internal dessicant film is made of a silica material.

* * * * *